United States Patent
Kim et al.

(10) Patent No.: US 7,629,692 B2
(45) Date of Patent: Dec. 8, 2009

(54) VIA HOLE HAVING FINE HOLE LAND AND METHOD FOR FORMING THE SAME

(75) Inventors: Chong Ho Kim, Chungcheongbuk-do (KR); Jong Min Choi, Chungcheongbuk-do (KR); Young Hwan Shin, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 26 days.

(21) Appl. No.: 11/484,708

(22) Filed: Jul. 12, 2006

(65) Prior Publication Data

US 2007/0132087 A1     Jun. 14, 2007

(30) Foreign Application Priority Data

Dec. 12, 2005  (KR) .................. 10-2005-0121752

(51) Int. Cl.
  *H01L 21/00* (2006.01)
(52) U.S. Cl. ................. 257/774; 257/E23.015
(58) Field of Classification Search ......... 257/773–776, 257/758, 621, E23.015, E23.02; 205/182
See application file for complete search history.

(56) References Cited

U.S. PATENT DOCUMENTS

| | | | |
|---|---|---|---|
| 5,495,665 A | | 3/1996 | Carpenter et al. |
| 2005/0124196 A1 | | 6/2005 | Olson et al. |
| 2005/0241954 A1 | * | 11/2005 | Iwanami ............... 205/182 |

FOREIGN PATENT DOCUMENTS

| | | | |
|---|---|---|---|
| JP | 4-286389 | | 10/1992 |
| JP | 8-186373 | * | 7/1996 |
| JP | 2000-151067 | | 11/1998 |
| JP | 2000-294924 | | 10/2000 |
| JP | 2002-314257 | | 10/2002 |
| JP | 2004-146668 | | 5/2004 |
| JP | 2004-303856 | | 10/2004 |

OTHER PUBLICATIONS

U.S. Appl. No. 12/068,457, filed Feb. 6, 2008, Chong Ho Kim, Samsung Electro-Mechanics, Co., Ltd.
U.S. Office Action mailed Apr. 28, 2009 in corresponding U.S. Appl. No. 12/068,457.
U.S. Office Action mailed Oct. 7, 2008 in corresponding U.S. Appl. No. 12/068,457.

* cited by examiner

*Primary Examiner*—Davienne Monbleau
*Assistant Examiner*—Hoa B Trinh
(74) *Attorney, Agent, or Firm*—Staas & Halsey LLP

(57) ABSTRACT

A via hole having a fine hole land includes a first conductive layer formed on an inner wall of the via hole, the first conductive layer being in contact with a hole formed in an insulation layer and extendedly projected to the outside and having the same diameter as the hole in the insulation layer; a second conductive layer contacted with the first conductive layer and formed on an inner wall thereof and projected to the outside and having the same height as the first conductive layer; and a circuit line, formed on the insulation layer, to connect the first conductive layer extendedly projected to the outside of hole in the insulation layer, where the second conductive layer has the same height as the first conductive layer and the fine hole land is connected to wire bonding pad or solder ball pad through the circuit line.

4 Claims, 9 Drawing Sheets

VIA HOLE HAVING FINE HOLE LAND AND METHOD FOR FORMING THE SAME

FIELD OF THE INVENTION

The present invention relates to a via hole and a method for forming the same. More particularly, the present invention relates to a via-hole having a fine hole land, with which the density of circuit patterns can be increased, and a method for forming the same.

BACKGROUND OF THE INVENTION

With the recent evolution of electronics to slimness, lightness and high performance and with the rapid increase in the application of built-up PCBs (printed circuit boards) to light, slim and small electronic products including wireless communication terminals, digital camcorders, mobile computers, etc., multilayer PCBs are very extensively used.

Multilayer PCBs enable interconnections to be achieved three dimensionally as well as in planes. Particularly, multilayer PCBs can improve the integration of functional devices, such as ICs (integrated circuit), LSICs (large scale integrated circuit), etc., allowing electronic products to have slimness, lightness, and high performance, to achieved structural integration of electric functions and to be produced in a significantly reduced assembly time period and at a low cost.

Almost all the built-up PCBs employed in such applications have via-holes through which interlayer connection is achieved. The recent tendency toward slimness and lightness is causing laser drills to be the new rising technology used for the formation of the via-holes.

Via-holes, corresponding to passageways for interlayer electric connection, were conventionally formed using mechanical drills. However, mechanical drilling results in too large a hole to form fine circuits, in addition to increasing the production cost. Nowadays, laser drilling is preferred.

Generally representative of new, smaller vias, called "microvias", a blind via is drilled from the surface of a PCB and terminates within the substrate.

If the cross-sectional area that a via occupies decreases, the ability to utilize vias increases by a similar amount.

However, the reduction of via size to microvia size means that mechanical drilling is of no commercial use, implying the generalization of some alternative processes, such as removal by way of laser or plasma.

The removal of material is the result of an electrochemical reaction to laser pulse or plasma treatment, which is different from a cutting action or treatment. However, removal processes similar to laser pulse or plasma treatment eliminate materials around the central line as well.

Because it primarily results in round holes, such removal, whether using laser, plasma, or others, competes with mechanical drilling. The formation of the round holes is often called 'drilling' due to the removal of materials around the central line, and is thus termed "micro via drilling".

With reference to FIGS. 1A to 1D, the formation of via-holes in a PCB using a conventional laser drilling process is schematically shown in a stepwise manner.

The conventional method for forming via holes in a PCB by laser drilling, as shown in FIGS. 1A to 1D, comprises a laser drilling process, a desmearing and copper plating process, and a circuit patterning process.

Figure 1A:
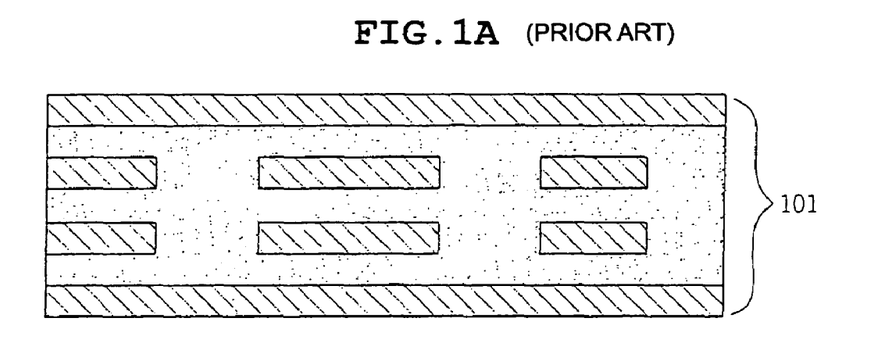
FIGS. 1A to 1D are schematic views showing conventional processes of forming via holes in a printed circuit board using a laser drill.
Figure 1B:
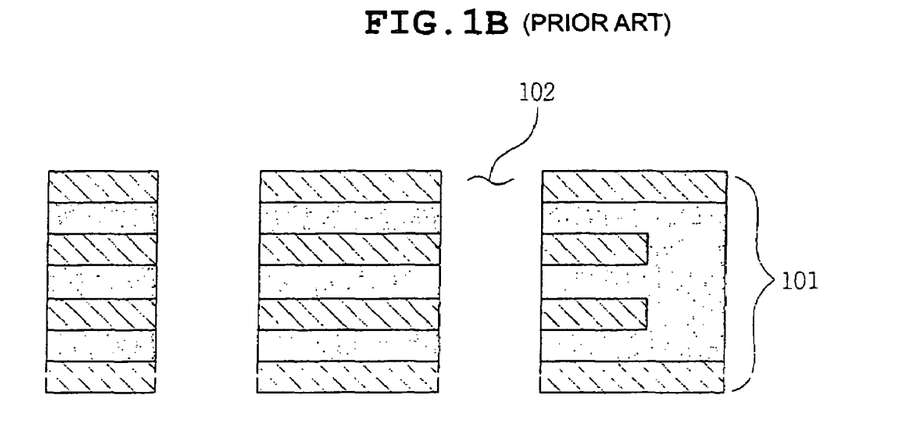

The formation of via holes in a PCB starts with the drilling of a copper clad laminate 101 of FIG. 1A to form via holes 102 which travel through two layers, as shown in FIG. 1B.

Figure 1C:
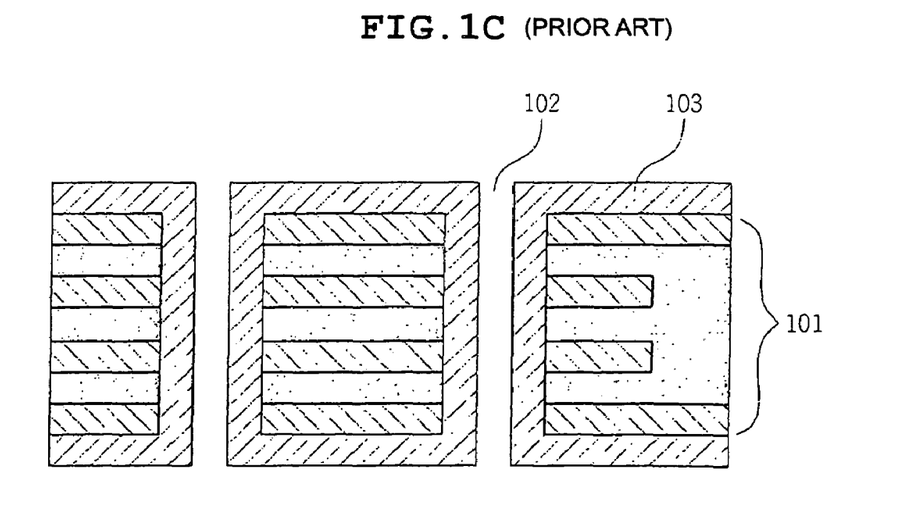
Figure 1D:
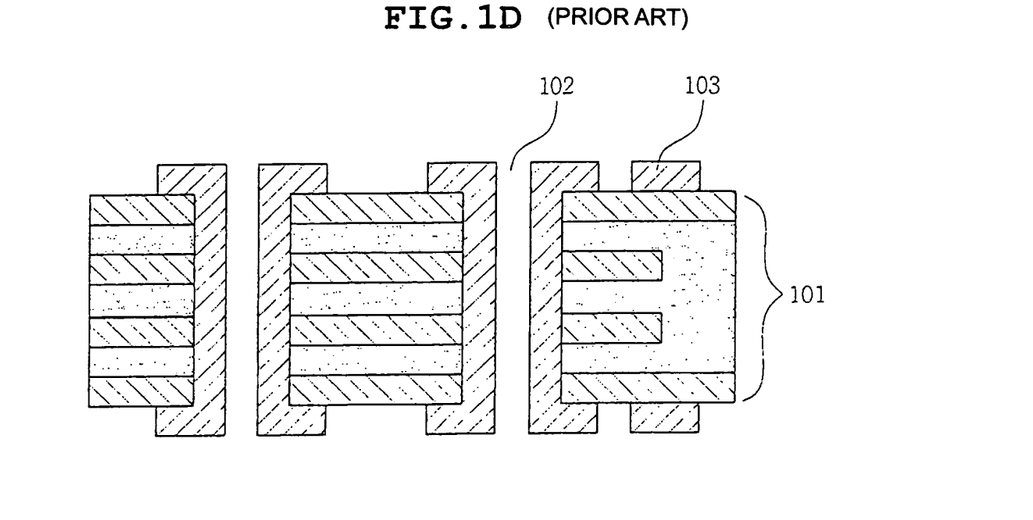

Next, as shown in FIG. 1C, a desmearing process is conducted, immediately followed by plating the inner walls of the holes with copper to form a copper-plated layer 103.

Subsequently, the copper-plated layer 103 is patterned to form a circuit.

Figure 2A:
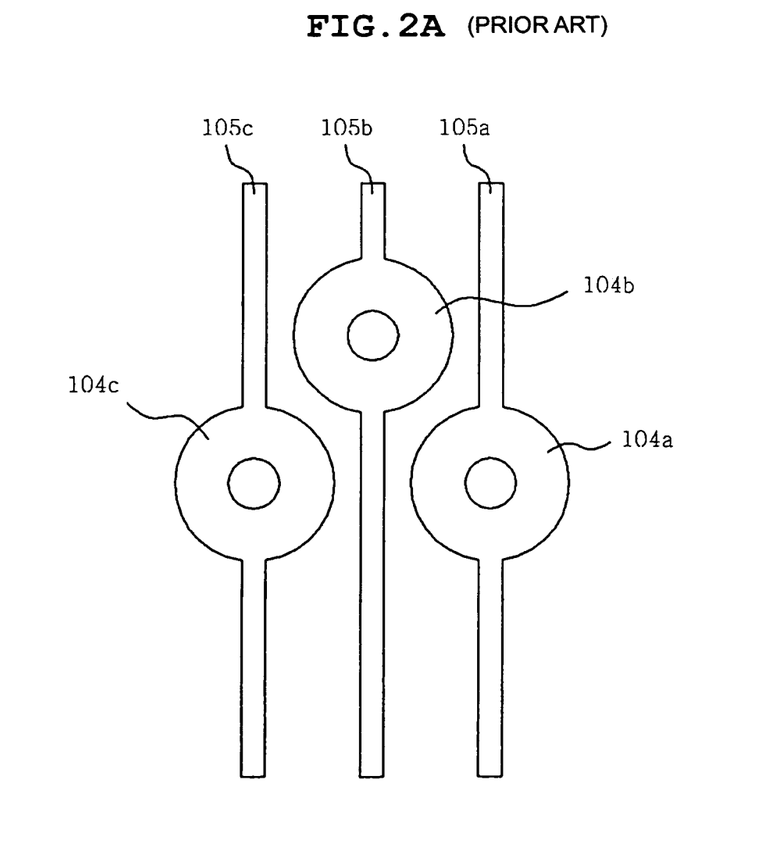
FIGS. 2A and 2B are a plan view and a perspective view, respectively, showing via holes formed according to the conventional processes.

As a rule, the via holes 102 require hole lands for electrical interconnection. However, the hole lands of via holes act as hindrances to the increase of the degree of integration of circuit patterns. Referring to FIG. 2A, which shows conventional via-holes in a plan view, hole lands 104a~104c prevent circuit lines 105a~105c from being arranged near each other. As shown in FIG. 2A, although the via holes are disposed in a zigzag manner in order to reduce the distance between circuit lines 105a~105c, the hole lands 104a~104c still interfere with the approach of the circuit line 105a~105c to each other.

Figure 2B:
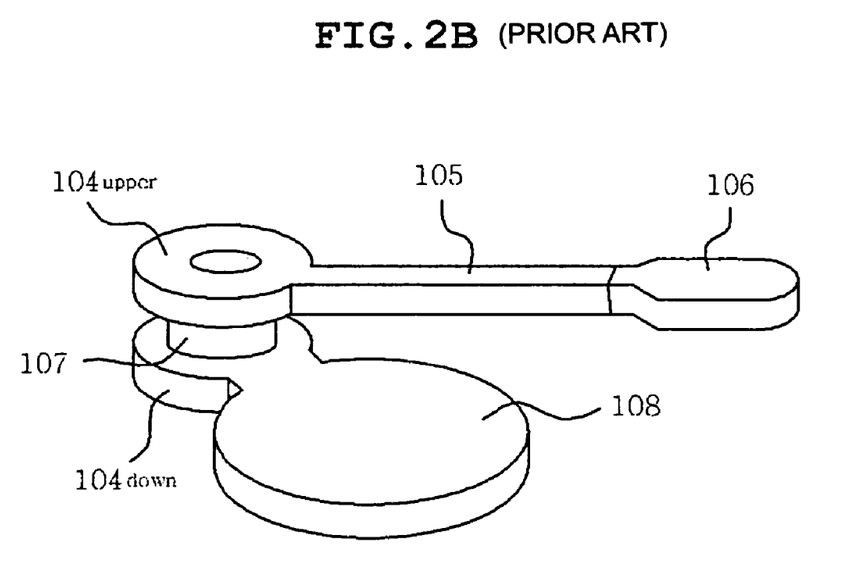

FIG. 2B is a perspective view showing a via hole according to a conventional technology. The via hole, as shown in FIG. 2B, comprises a hole inner wall 107 associated with an upper hole land 104u at its upper portion and with a down hole land 104d at its lower portion. The upper hole land 104u is extended through a circuit line 105 to a wire bonding pad 106 while the down hole land 104d is associated with a solder ball pad 108. As can be seen, the hole lands 104u and 104d still occupy large areas.

SUMMARY OF THE INVENTION

Therefore, it is an object of the present invention to provide a via hole having a fine hole land with which circuit patterns can be constructed at a high density, and a method for forming the same.

In accordance with an aspect of the present invention, provided is a via hole having a fine hole land, comprising a first conductive layer formed on an inner wall in contact with an insulation layer; a second conductive layer outside the first conductive layer; and a circuit line, formed on the insulation layer, connecting to the second conductive layer, wherein the hole land is formed by the first and the second conductive layer.

In a preferable embodiment, the first conductive layer is extended over the insulating layer.

In another preferable embodiment, the first layer is an electroless plated layer.

In a further preferable embodiment, the second conductive layer is an electroplated layer.

In accordance with another aspect of the present invention, provided is a method for forming a via hole having a fine hole land, comprising: step 1 of forming a via hole in a copper clad laminate, coating an etching resist over the copper clad laminate, and forming a circuit pattern on the copper foil of the copper clad laminate; step 2 of forming a seed layer, coating a photoresist, and exposing an inner wall of the via hole; and step 3 of forming a plated layer on the inner wall of the via hole and removing the photoresist and the seed layer.

BRIEF DESCRIPTION OF THE DRAWINGS

The application of the preferred embodiments of the present invention is best understood with reference to the accompanying drawings, in which like reference numerals are used for like and corresponding parts, wherein.

DESCRIPTION OF THE PREFERRED EMBODIMENT

Below, a detailed description is given of an embodiment of the present invention with reference to the accompanying drawings.

Figure 3A:
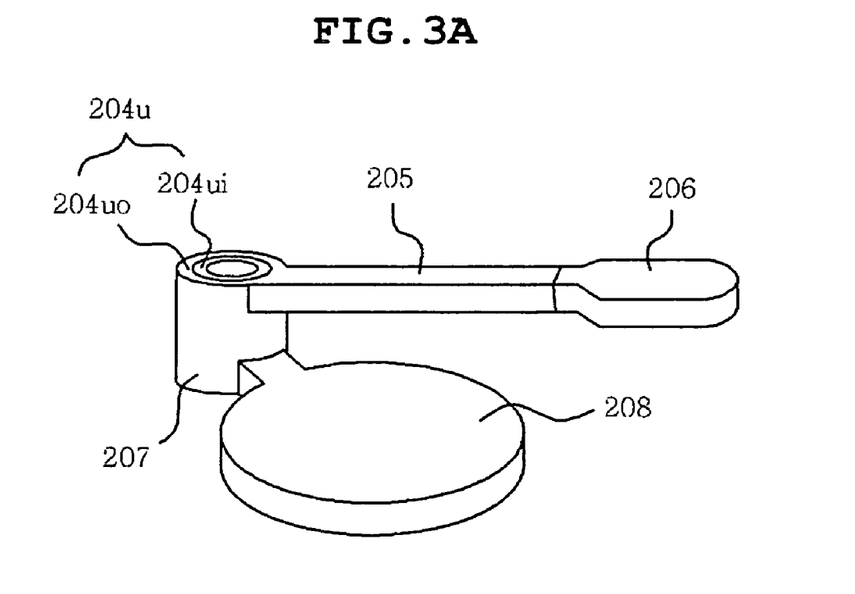
FIGS. 3A and 3B are a perspective view and a plan view, respectively, showing a via hole having a fine hole land in accordance with the present invention.
Figure 3B:
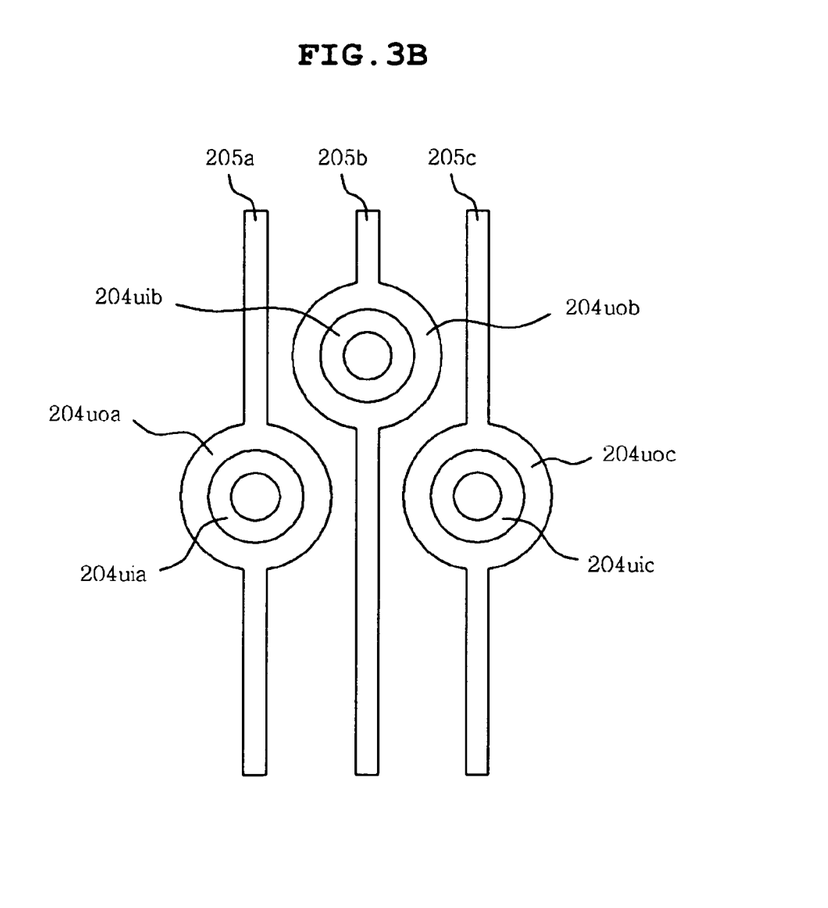

A via-hole having a fine hole land in accordance with an embodiment of the present invention is shown in the perspective view of FIG. 3A while FIG. 3B. shows the arrangement of a plurality of the via holes in a plan view.

In accordance with the present invention, a via hole having a fine hole land comprises a conductive inner wall layer 207, an upper hole land 204u (consisting of 204ui and 204uo), a down hole land 204d (consisting of 204di and 204do), a wire bonding pad 206, a solder ball pad 208, and a circuit line 205 for connecting the wire bonding pad 206 with the upper hole land 204u, as shown in FIG. 3A.

The hole land 204u is as large as the conductive inner wall layer 207 and is divided into an inner hole land 204ui and an outer hole land 204uo, which extends from the inner hole land 204ui. Preferably, the outer hole land 204uo ranges in thickness from 0 to 15 µm. The inner hole land 204ui has a thickness of 10 µm. Although they are made from the same material, that is, copper, the inner hole land 204ui and the outer hole land 204uo are different in crystalline structure from each other because different processes are used. Specifically, the inner hole land 204ui is electroplated with copper while the outer hole land 204uo consists of an electroless copper plated layer and electro-copper plated layer.

FIG. 3B shows the arrangement of a plurality of the via holes having the fine hole lands 204ui and 204uo in a plan view. As shown in FIG. 3B, the thinness of the outer hole lands 204uoa to 204uoc allows circuit lines 205a to 205c to be disposed closely adjacent to each other, increasing the degree of integration of the circuit patterns.

Figure 4A:
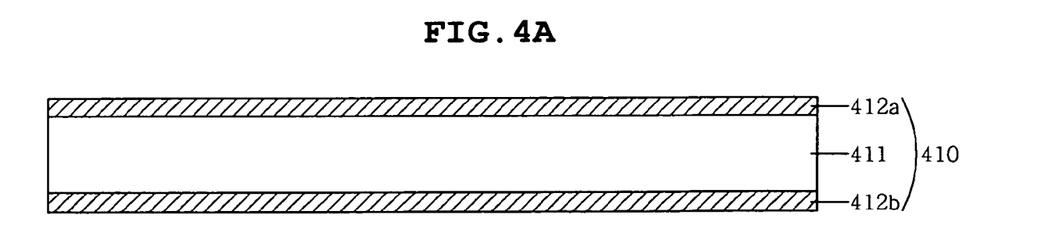
FIGS. 4A to 4R are schematic views showing processes of forming a via hole having a fine hole land in accordance with the present invention.
Figure 4B:
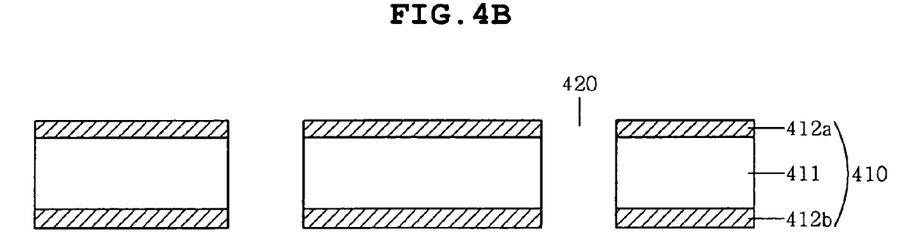
Figure 4C:
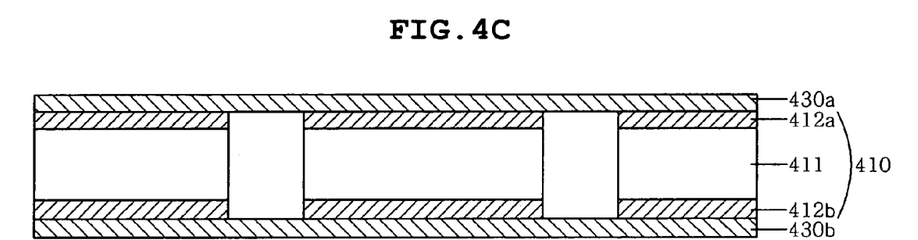
Figure 4D:
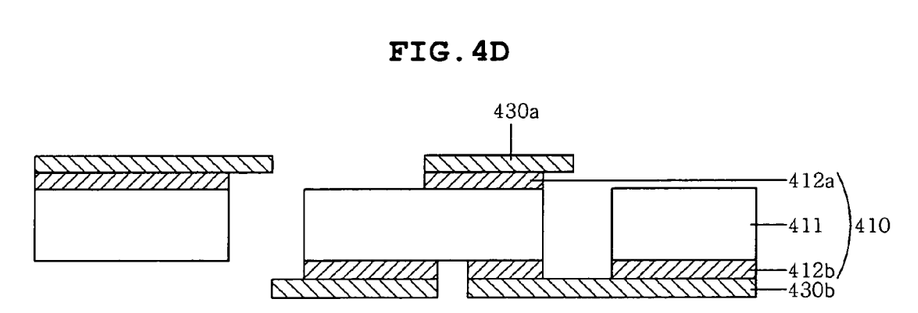
Figure 4E:
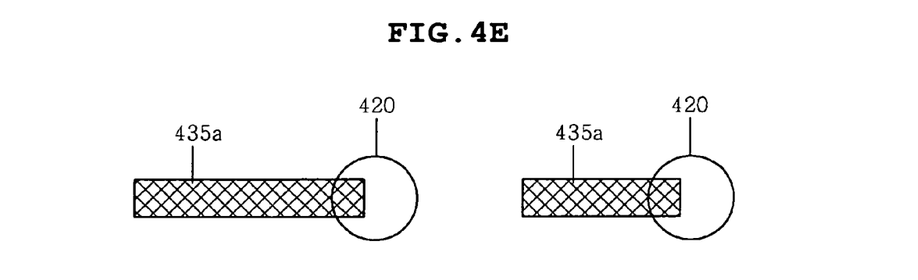
Figure 4F:
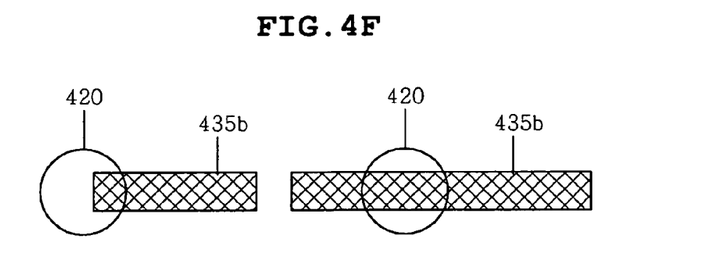
Figure 4G:
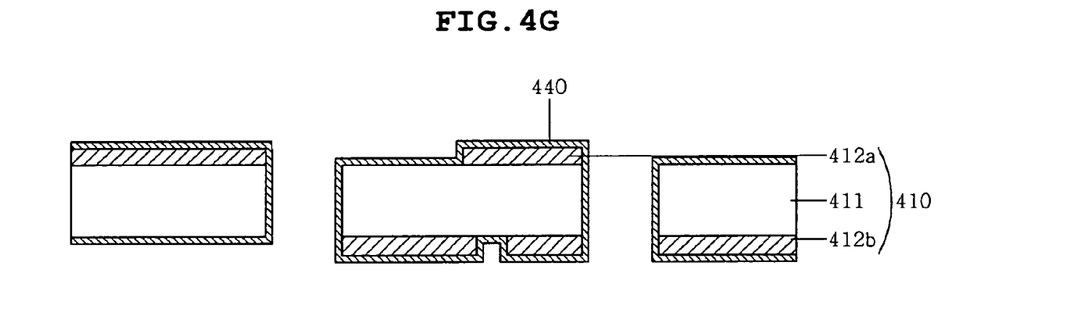
Figure 4H:
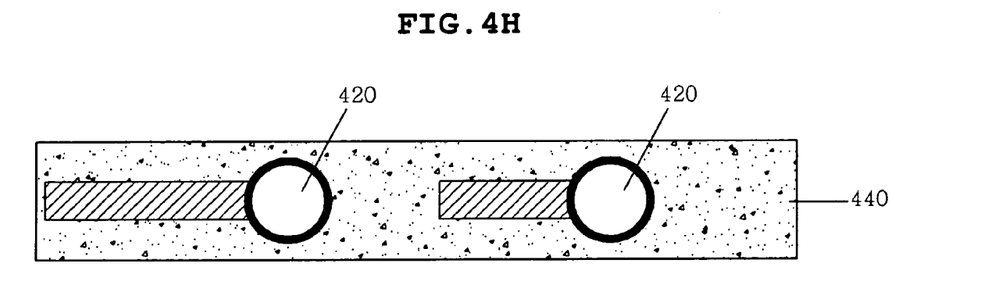
Figure 4I:
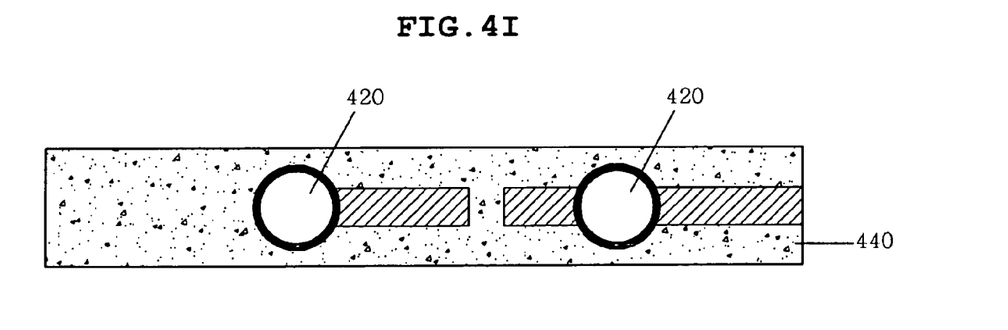
Figure 4J:
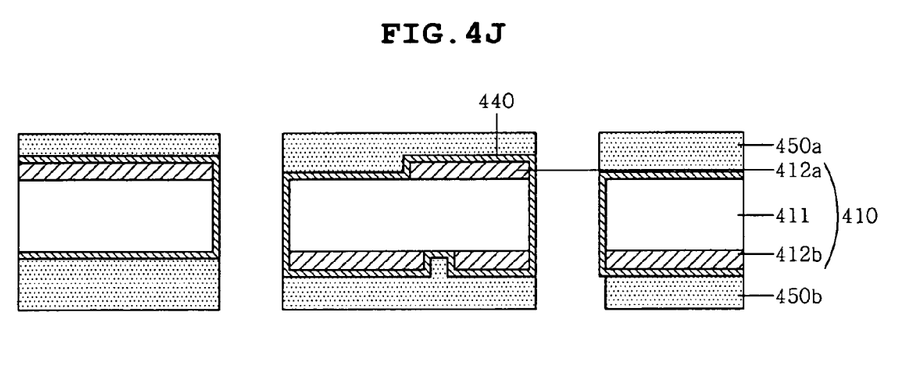
Figure 4K:
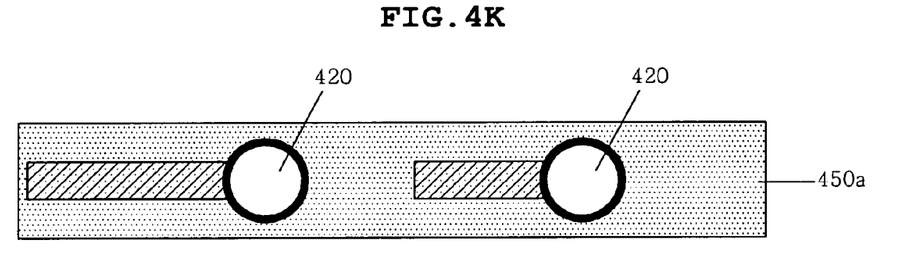
Figure 4L:
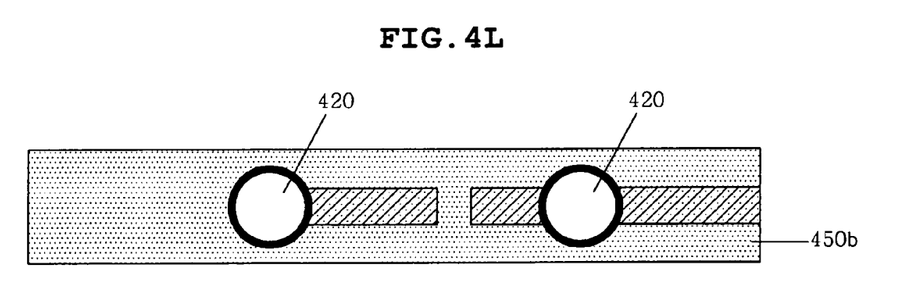
Figure 4M:
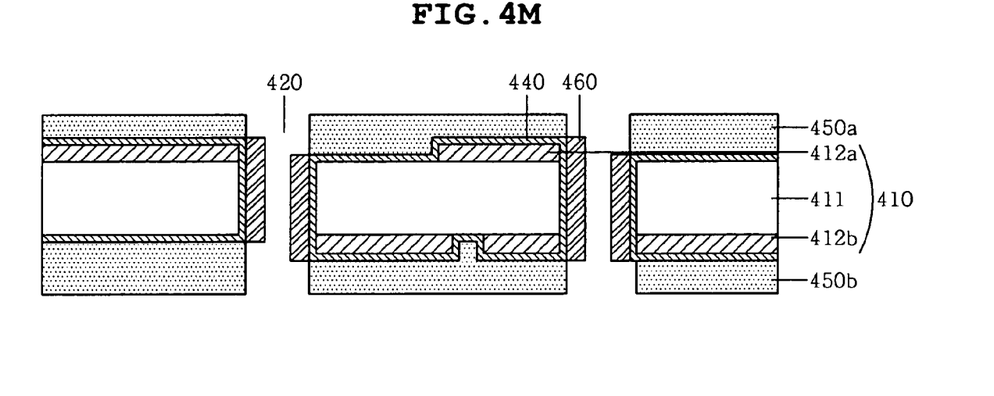
Figure 4N:
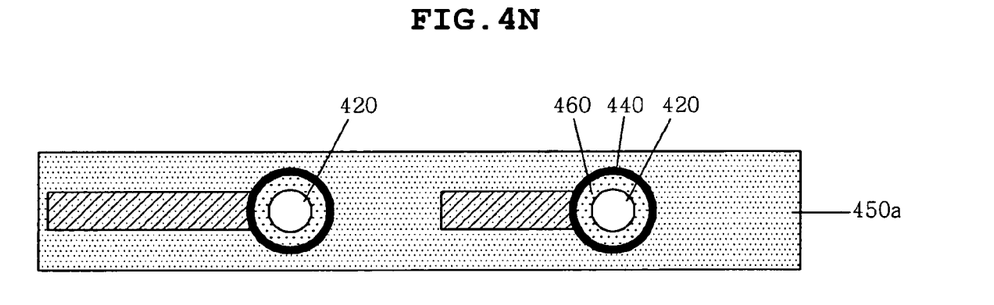
Figure 4O:
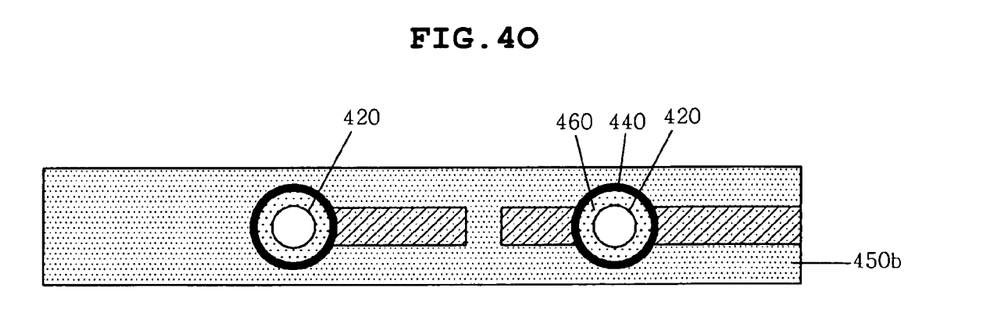
Figure 4P:
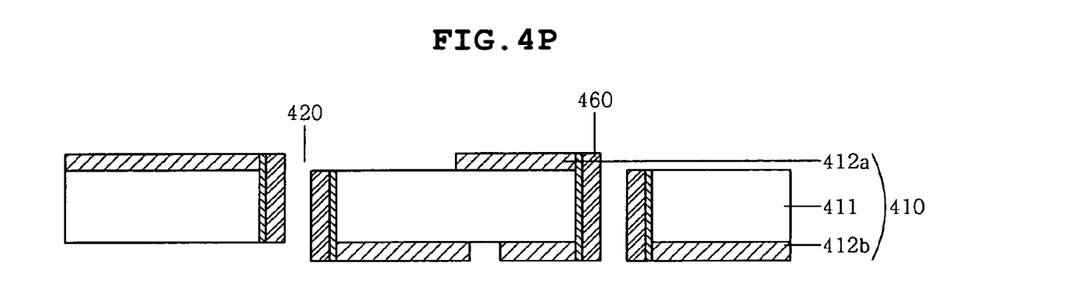
Figure 4Q:
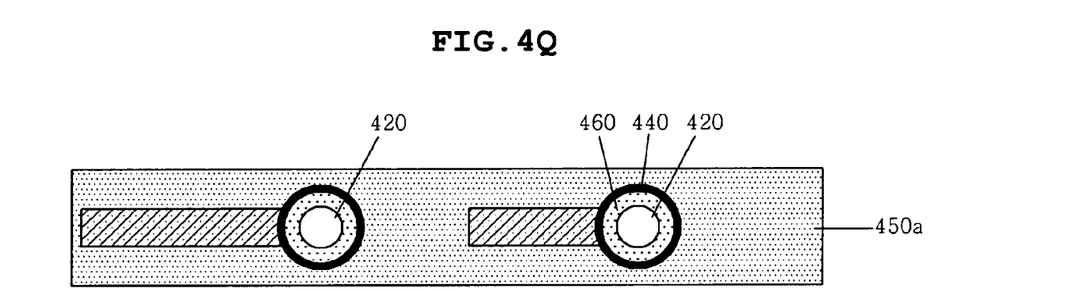
Figure 4R:
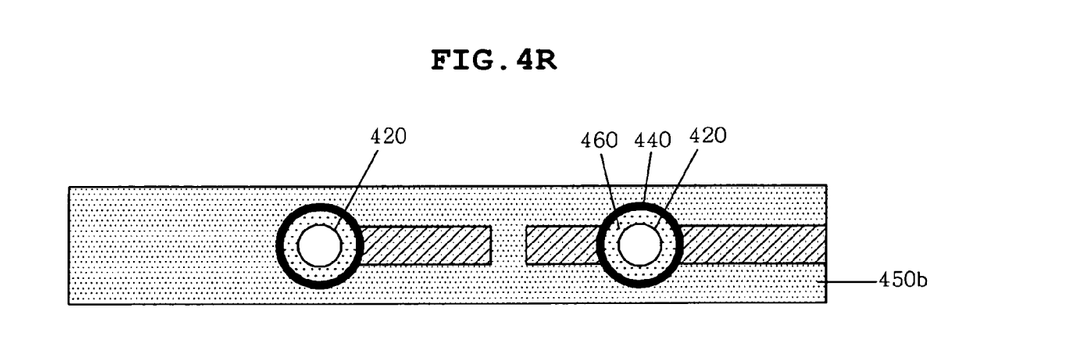

With reference to FIGS. 4A to 4R, a method of forming a via hole in accordance with an embodiment of the present invention is illustrated in a stepwise manner.

First, as shown in FIG. 4A, a copper clad laminate 410 comprising an insulation layer 411 with respective copper layers 412a and 412b formed on opposite faces thereof is provided.

The insulation layer 411 is based on resin. Resinous materials show high insulation properties, but suffer from the disadvantage of being poor in mechanical strength and being dimensionally more unstable in response to temperature change than metallic materials. In order to overcome the disadvantages, paper, glass fiber, or glass non-woven fabric is used as a reinforcement. The reinforcement increases the strength of the resinous material in both widthwise and lengthwise directions and decreases the dimensional change with temperature.

The copper clad laminate 410, although shown having copper layers 412a and 412b on opposite faces thereof, may comprise only one copper layer.

FIG. 4B is a schematic cross sectional view after the copper clad laminate (410) is drilled to form via holes 420.

As currently available technologies for forming via holes in PCBs, there are excimer, Nd:YAG and $CO_2$ laser drilling processes.

Excimer laser is not applied to PCBs. A YAG laser using 355 nm can drill through the copper layer, but is 90% reflected by glass epoxy, which may be used in a prepreg form for the insulation layer.

In contrast, a $CO_2$ laser of 9.4 µm can be applied for drilling the copper clad laminate because it is absorbed in an amount of 80%.

Afterward, as shown in FIG. 4C, etching resists 430a, 430b are formed on either or both surfaces of the copper clad laminate 410 having the via holes 420 therein. The formation of the etching resists can be achieved in a photographic process or a screen printing process. For the photographic process, a dry film may be an etching resist, as in a D/F method, or a liquid photosensitive material may be used.

FIG. 4D is a cross sectional view after an image forming process is conducted to form a pattern of the etching resists 430a, 430b on the copper layers 412a, 412b, respectively and an etchant is sprayed to remove the copper layer 412a, 412b from predetermined areas, with the pattern of the etching resists serving as a mask. The resulting copper clad laminate 410 is shown in the plan view of FIG. 4E and in the rear view of FIG. 4F. As shown in FIG. 4E, a circuit line 435a extends into the via hole 420. In addition, a circuit line 435b is formed on the lower surface of the copper clad laminate 410 so as to extend into or over the via hole 420, as shown in FIG. 4F.

Subsequently, as shown in FIG. 4G, copper plating is conducted to form a seed layer 440. The resulting copper clad laminate 410 is shown in the plan view of FIG. 4H and in the rear side view of FIG. 4I. For the copper plating, electroless plating (or sputter) is performed prior to electroplating. The seed layer 440 preferably has a thickness from 0.5 to 1.5 µm.

Electroless copper plating (or sputtering) is a technique for providing conductivity for insulators such as resins, ceramics, glass, etc. Performed in such a way that a substrate is immersed in a plating solution, electroless copper plating allows all parts of the substrate, including the inner wall of the hole, to be plated with copper. By this electroless copper plating, called primary copper plating, the upper copper layer is electrically connected with the lower copper layer. The primary copper plating results in a preliminary thin coat for subsequent electroplating. Due to poor physical properties, the electroless plated copper coat must be overcoated with copper through electroplating.

The electric conductivity imparted to the inner wall of the hole by electroless copper plating enables electroplating to be applied thereto. The copper coat formed by electroplating is much thicker and exhibits better physical properties than the copper coat formed by electroless plating.

Subsequently, as shown in FIG. 4J, a photoresist 450a, 450b is selectively formed over the copper clad laminate 410 in such a way that only the inner wall of the via hole 420 is exposed. The photoresist 450a, 450b can be formed using a photographic method or a screen printing method. For the photographic method, a dry film may be used as an etching resist, as in a D/F method, or a liquid photosensitive material may be used.

Afterwards, an image forming process is performed to remove the part of the photoresist 450a, 450b corresponding to the via hole 420 to expose the inner wall of the via hole 420. The resulting structure of the copper clad laminate 410 is shown in the plan view of FIG. 4K and in a rear side view of FIG. 4L. As shown in both FIGS. 4K and 4L, only the inner wall of the via hole 420 is exposed.

FIG. 4M is a cross sectional view after a copper coat is formed on the inner wall of the via hole 420 with the seed layer 440 serving as a plating bar. Preferably, the copper coat 460 has a thickness of 10 μm or greater. A 10 μm thick or thicker copper coat 460 assures reliable electric conduction between the upper and the lower layers.

The resulting structure of the copper clad laminate, in which the copper coat 460 is formed on the inner wall of the via hole 420, is shown in the plan view of FIG. 4N and in the rear side view of FIG. 4O.

FIG. 4M illustrates that a first conductive layer formed on an inner wall of the hole in contact with a hole formed in an insulation layer and extendedly projected to the outside with the same size of a diameter of the hole in the insulation layer; a second conductive layer contacted with the first conductive layer and formed on an inner wall thereof and projected to the outside with the same height of the first conductive layer.

With reference to FIGS. 4N and 4O, the relatively thin seed layer 440 is formed on the inner wall of the via hole 420 while being coated with the relatively thick copper layer 460.

Thereafter, as shown in FIG. 4P, the photoresist 450a, 450b is peeled off and the seed layer is removed by flash etching so as to form a circuit.

Then, a photo solder resist process and subsequent processes are conducted as usual.

As described hereinbefore, the present invention can decrease the area occupied by hole lands so as to increase the density of via holes, thereby realizing slimness of the PCB.

That is, the present invention increases the number of circuit lines per unit area, thus increasing the density of circuit patterns.

In addition, the present invention can be applied to the slimness of all electronic appliances which require fine patterns.

Examples are described in terms of the preferred embodiment of present invention. However, it should be understood that such disclosure is not limited to the explicit description of the present invention. The description and the claims of present invention are to be interpreted as covering all alterations and modifications within the true scope of this invention.

What is claimed is:

1. A via hole having a fine hole land, the via hole being adjacent to a hole formed in an insulation layer of a printed circuit board, the via hole comprising:
   a first conductive layer formed on an inner wall of the via hole, the first conductive layer being in contact with the hole formed in the insulation layer and extendedly projected to the outside and having the same diameter as the hole in the insulation layer;
   a second conductive layer contacted with the first conductive layer and formed on an inner wall thereof and projected to the outside and having the same height as the first conductive layer; and
   a circuit line, formed on the insulation layer, to connect the first conductive layer extendedly projected to the outside of hole in the insulation layer,
   wherein the fine hole land comprises the first conductive layer projected to the outside with the same size of the hole in the insulation layer, and the second conductive layer projected to the outside with the same height of the first conductive layer and the fine hole land is connected to a wire bonding pad or a solder ball pad through the circuit line, and
   the thickness of the first conductive layer is 0.5~1 μm and the thickness of the second conductive layer is more than 10 μm.

2. The via hole as set forth in claim 1, wherein the first conductive layer is extended over the insulating layer.

3. The via hole as set forth in claim 1, wherein the first conductive layer is an electroless plated layer.

4. The via hole as set forth in claim 1, wherein the second conductive layer is an electroplated layer.

* * * * *